(12) United States Patent
Uemura

(10) Patent No.: US 8,362,829 B2
(45) Date of Patent: Jan. 29, 2013

(54) SEMICONDUCTOR DEVICE

(75) Inventor: Hitoshi Uemura, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 142 days.

(21) Appl. No.: 13/034,142

(22) Filed: Feb. 24, 2011

(65) Prior Publication Data
US 2011/0285459 A1  Nov. 24, 2011

(30) Foreign Application Priority Data

May 20, 2010  (JP) ................................. 2010-116226

(51) Int. Cl.
*H01L 25/00* (2006.01)
(52) U.S. Cl. ....................................................... 327/564
(58) Field of Classification Search .................. 327/512, 327/513, 564, 565, 566, 581, 583
See application file for complete search history.

(56) References Cited

U.S. PATENT DOCUMENTS

| | | | |
|---|---|---|---|
| 5,434,453 A * | 7/1995 | Yamamoto et al. | 257/777 |
| 8,232,836 B2 * | 7/2012 | Nicolas et al. | 327/565 |
| 2006/0072261 A1 | 4/2006 | Bayerer et al. | |

FOREIGN PATENT DOCUMENTS

| | | |
|---|---|---|
| DE | 10 2004 046 806 A1 | 4/2006 |
| EP | 2 124 257 A1 | 11/2009 |
| JP | 11-163257 | 6/1999 |
| JP | 2004-22983 | 1/2004 |
| JP | 2005-175074 | 6/2005 |
| JP | 2008-085169 | 4/2008 |

OTHER PUBLICATIONS

German Office Action issued Jun. 28, 2012 in Patent Application No. 10 2011 007 624.7 with English Translation.
Office Action issued Oct. 2, 2012 in Japanese Patent Application No. 2010-116226, filed May 20, 2010 (with English-language Translation), 6 pages.

* cited by examiner

*Primary Examiner* — Jeffrey Zweizig
(74) *Attorney, Agent, or Firm* — Oblon, Spivak, McClelland, Maier & Neustadt, L.L.P.

(57) ABSTRACT

A semiconductor device includes a power semiconductor array including a first power semiconductor located on one end of the power semiconductor array, a second power semiconductor located on the other end and a third power semiconductor located between the first and second power semiconductors and a diode array including a first diode located on one end of the diode array, a second diode located on the other end and a third diode located between the first and second diodes. A resistance value between an emitter electrode and a collector electrode in ON state is higher at the third power semiconductor than at the first and second power semiconductors. Upon application of a voltage of not less than a rising voltage, the third diode has a higher resistance value than resistance values of the first diode and the second diode upon application of a voltage not less than a rising voltage.

12 Claims, 6 Drawing Sheets

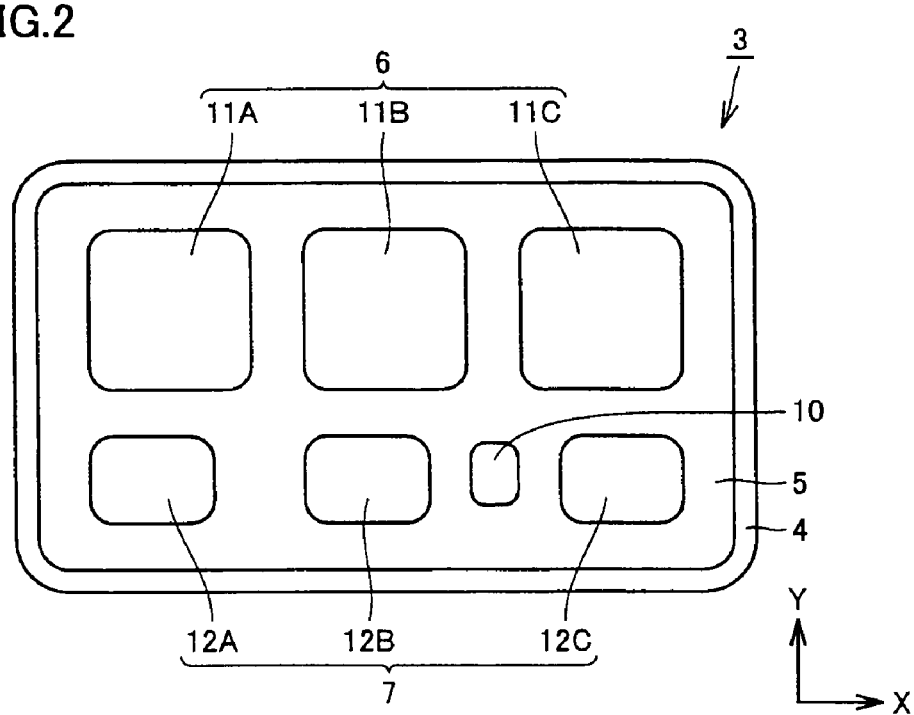
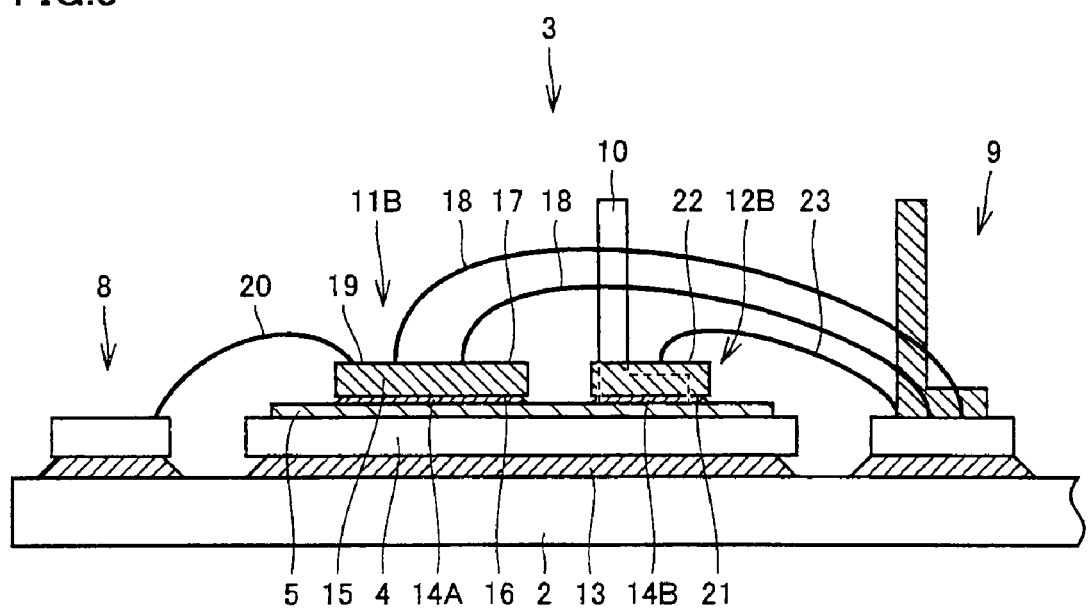

SEMICONDUCTOR DEVICE

BACKGROUND OF THE INVENTION

1. Field of the Invention

The present invention relates to a semiconductor device, and particularly to a semiconductor device in which thermal equalization of elements incorporated in the semiconductor device is achieved.

2. Description of the Background Art

Conventionally, various semiconductor devices with the objective of reducing temperature difference between semiconductor chips have been proposed.

For example, Japanese Patent Laying-Open No. 2005-175074 describes a semiconductor device including a plurality of IGBT chips arranged in parallel. Inner IGBT chips of the aligned IGBT chips have a smaller area than the area of IGBT chips arranged at either end of the aligned IGBT chips.

Japanese Patent Laying-Open No. 2004-022983 describes a semiconductor device including a power semiconductor element and a heat dissipating block, and the heat dissipating block is arranged laterally to the power semiconductor element.

In a recent semiconductor chip, a plurality of types of elements, such as a power semiconductor, a diode and a terminal are mounted on a substrate. Thus, when thermal equalization of the elements is sought after, focusing on a particular type of element may result in difficulty in achieving thermal equalization in relation to other elements.

In the semiconductor device described in Japanese Patent Laying-Open No. 2005-175074, a focus is made only on the IGBT chips, and no focus is made on other elements. This may cause thermal equalization of the IGBT chips to fail, depending on where the terminal and the diode are arranged.

The semiconductor device described in Japanese Patent Laying-Open No. 2004-022983 includes the heat dissipating block arranged laterally to the power semiconductor element, however, the power semiconductor element may not be sufficiently cooled, depending on the position at which other elements mounted around the power semiconductor element and the heat dissipating block are arranged.

The present invention has been made in view of the above-described problems, and an object of the present invention is to provide a semiconductor device which includes a plurality of types of elements incorporated therein such as a power semiconductor, a diode and a terminal, and in which thermal equalization of the elements is achieved.

SUMMARY OF THE INVENTION

In one aspect, the semiconductor device according to the present invention includes a power semiconductor array formed of a plurality of power semiconductors aligned and spaced in one direction, the power semiconductors each including an emitter electrode and a collector electrode, and a diode array spaced apart from the power semiconductor array in a direction intersecting with the one direction and formed of a plurality of diodes aligned and spaced in the one direction. The power semiconductor array includes a first power semiconductor located on one end of the power semiconductor array, a second power semiconductor located on the other end, and a third power semiconductor located between the first power semiconductor and the second power semiconductor. The diode array includes a first diode located on one end of the diode array, a second diode located on the other end, and a third diode located between the first diode and the second diode.

A resistance value between the emitter electrode and the collector electrode in ON state is higher at the third power semiconductor than at the first power semiconductor and at the second power semiconductor. Upon application of a voltage of not less than a rising voltage, the third diode has a higher resistance value than resistance values of the first diode and the second diode upon application of a voltage of not less than a rising voltage.

In another aspect, the semiconductor device according to the present invention includes an insulating substrate, a circuit board provided on the insulating substrate, an array of elements provided on the circuit board and including a plurality of elements aligned and spaced in one direction, a first connecting terminal located closer to one end of the array of elements than a central portion of the array of elements on an upper surface of the circuit board, and a second connecting terminal located closer to the other end of the array of elements than the central portion of the array of elements on the upper surface of the circuit board.

In still another aspect, the semiconductor device according to the present invention includes an insulating substrate, a circuit board provided on the insulating substrate, a power semiconductor array provided on the circuit board and including a plurality of power semiconductors aligned in one direction, and a connecting terminal spaced apart from one end of the power semiconductor array. The power semiconductor includes an emitter electrode and a collector electrode. The power semiconductor array includes a first power semiconductor located on the one end and a second power semiconductor located on the other end. A resistance value between the emitter electrode and the collector electrode in ON state is higher at the first power semiconductor than at the second power semiconductor.

In a further aspect, the semiconductor device according to the present invention includes an insulating substrate, a circuit board provided on the insulating substrate, a first power semiconductor and a second power semiconductor provided on the circuit board and spaced, a connecting terminal connected to a portion of an upper surface of the circuit board, the portion being located between the first power semiconductor and the second power semiconductor, and a diode located, relative to the second power semiconductor, on a side opposite to the connecting terminal.

According to the semiconductor device of the present invention, even in a semiconductor device which includes a plurality of kinds of elements incorporated therein such as a power semiconductor, a diode and a terminal, thermal equalization of the incorporated elements can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a plan view showing a semiconductor unit shown in FIG. 1.

FIG. 3 is a cross sectional view taken along a line III-III shown in FIG. 1.

DESCRIPTION OF THE PREFERRED EMBODIMENTS

Semiconductor devices according to embodiments of the present invention will be described using FIGS. 1-10. It is noted that when a number, an amount or the like is mentioned in the embodiments to be described below, the scope of the present invention is not necessarily limited by the number, the amount or the like, unless otherwise described. Further, in the following embodiments, each constituting element is not necessarily essential to the present invention, unless otherwise described.

First Embodiment

Figure 1:
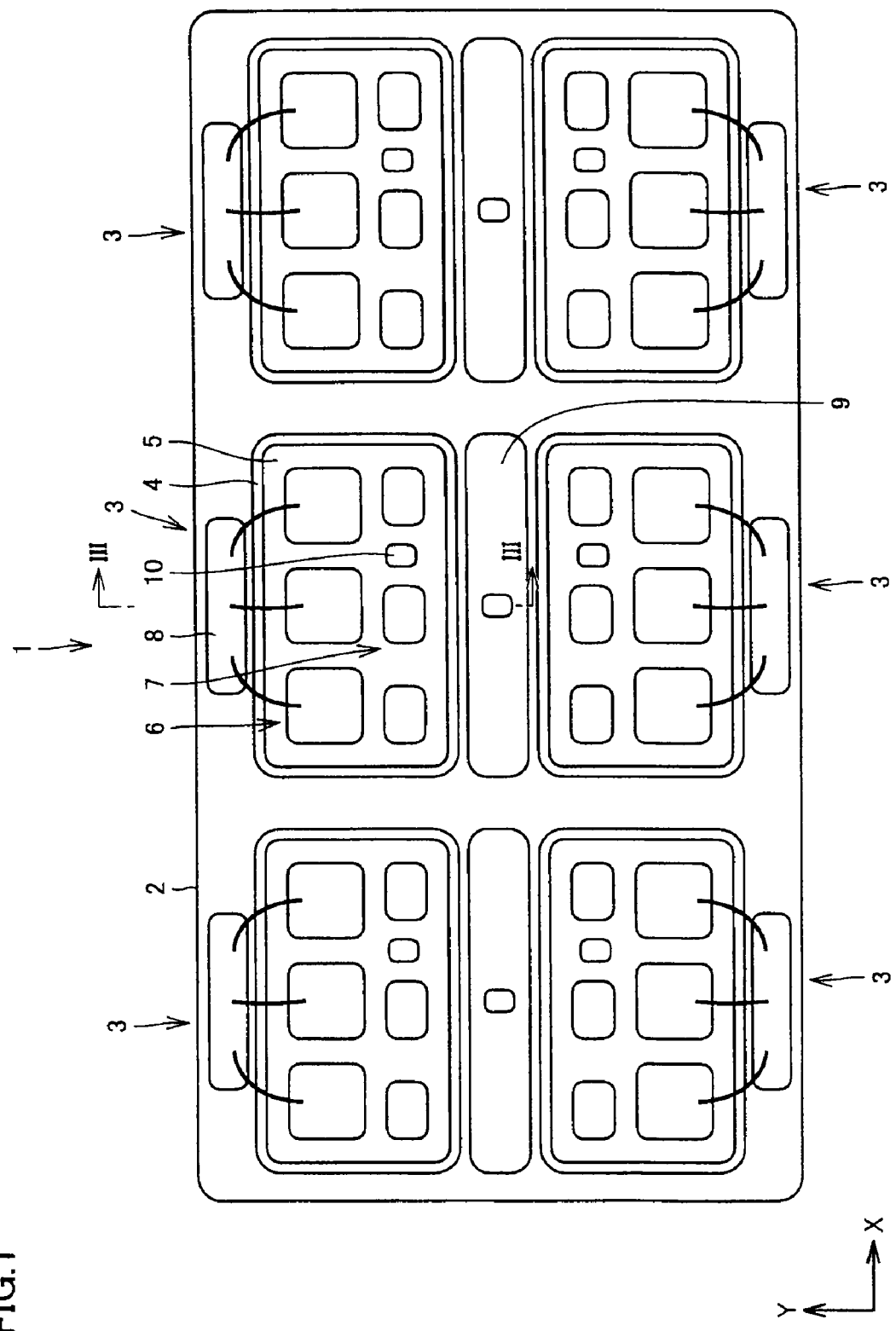
FIG. 1 is a plan view of a semiconductor device.

FIG. 1 is a plan view of a semiconductor device 1. As shown in FIG. 1, semiconductor device 1 includes a semiconductor substrate 2 as well as a plurality of semiconductor units 3, control terminal parts 8, and emitter terminal parts 9, which are provided on a main surface of semiconductor substrate 2.

Semiconductor substrate 2 has a rectangular shape which is elongated in the first direction X in plan view. Semiconductor units 3 include three semiconductor units 3 spaced in the first direction X, and two semiconductor units 3 spaced in the second direction Y. It is noted that the number of semiconductor units 3 aligned in the first direction X and the number of semiconductor units 3 aligned in the second direction Y are not limited to the above-described numbers.

Control terminal parts 8 are formed in the vicinity of the sides of the periphery of semiconductor substrate 2, which are aligned in the second direction Y. Control terminal parts 8 are arranged to be adjacent to semiconductor units 3, respectively. Emitter terminal parts 9 are arranged between semiconductor units 3 aligned in the second direction Y.

Semiconductor unit 3 includes an insulating substrate 4 provided on the main surface of semiconductor substrate 2, a circuit board 5 provided on an upper surface of insulating substrate 4, a power semiconductor array 6 and a diode array 7 which are provided on an upper surface of circuit board 5, and a collector terminal part 10 provided on the upper surface of circuit board 5.

FIG. 2 is a plan view showing semiconductor unit 3 shown in FIG. 1. As shown in FIG. 2, insulating substrate 4 has an approximately rectangular shape. Power semiconductor array 6 includes a plurality of IGBTs (Insulated Gate Bipolar Transistor) 11A, 11B, 11C which are aligned and spaced in a longitudinal direction (one direction) of insulating substrate 4. It is noted that although an example employing IGBTs as power semiconductor elements to form power semiconductor array 6 will be described, other elements may be employed as power semiconductor elements.

Power semiconductor array 6 includes IGBT 11A located on one end of power semiconductor array 6, IGBT 11C located on the other end, and IGBT 11B located between IGBT 11A and IGBT 11C. It is noted that in the example shown in FIG. 2, power semiconductor array 6 is configured to include three IGBTs, and therefore, one IGBT 11B is located between IGBT 11A and IGBT 11C.

Diode array 7 is spaced apart from power semiconductor array 6 in a widthwise direction of insulating substrate 4. It is noted that the widthwise direction of insulating substrate 4 is a direction intersecting with the longitudinal direction of insulating substrate 4. Diode array 7 is formed of a plurality of diodes 12A, 12B, 12C which are aligned and spaced in the longitudinal direction of insulating substrate 4.

Diode array 7 includes diode 12A located on one end of diode array 7, diode 12C located on the other end, and diode 12B located between diode 12A and diode 12C.

Collector terminal part 10 is provided between diode 12B and diode 12C. Formed on circuit board 5 are a plurality of interconnect lines, which connect collector terminal part 10 to IGBTs 11A-11C and diodes 12A-12C.

FIG. 3 is a cross sectional view taken along a line III-III shown in FIG. 1. As shown in FIG. 3, insulating substrate 4 is fixed on semiconductor substrate 2 by solder 13. IGBT 11B is fixed on circuit board 5 by solder 14A, and diode 12B is fixed on circuit board 5 by solder 14B. It is noted that collector terminal part 10 is also connected to circuit board 5 by solder or the like.

IGBT 11B includes, for example, a semiconductor substrate 15, a PNP transistor formed on semiconductor substrate 15, and an n-channel transistor for controlling base current. IGBT 11B further includes a collector electrode 16 formed on a lower surface of semiconductor substrate 15 and connected to circuit board 5, an emitter electrode 17 located on an upper surface of semiconductor substrate 15, and a gate electrode (base electrode) 19 of the n-channel transistor formed on the upper surface of semiconductor substrate 15.

When the difference between a voltage applied to gate electrode 19 and a voltage applied to emitter electrode 17 exceeds a threshold voltage of the n-channel transistor, resistance between collector electrode 16 and emitter electrode 17 is sharply decreased, and IGBT 11B turns ON. Then, collector current is outputted from collector electrode 16. Then, as the potential difference between the emitter electrode and the collector electrode is widen, the current flowing between the emitter electrode and the collector electrode becomes larger.

In a state where a voltage difference between a gate electrode and an emitter electrode is larger than a threshold voltage of an n-channel transistor, as described above, the value of resistance between a collector electrode and the emitter electrode is defined as an on resistance value of the IGBT. Also, a voltage under saturation between the collector electrode and the emitter electrode of IGBT is defined as a saturation voltage Vice (sat).

Emitter electrode 17 is connected to emitter terminal part 9 by a bonding wire 18, and gate electrode 19 is connected to control terminal part 8 by a bonding wire 20.

Diode 12B includes a cathode electrode 21 formed on a lower surface of diode 12B and an anode electrode 22 formed on an upper surface of diode 12B. Cathode electrode 21 is connected to circuit board 5 which connects cathode electrode 21 to collector terminal part 10. Anode electrode 22 is connected to emitter terminal part 9 by a bonding wire 23 formed of aluminum, for example. It is noted that a rising voltage (forward dropping voltage) of a diode is defined as a rising voltage (forward dropping voltage) Vf, and the value of resistance when a voltage of not less than rising voltage Vf is applied in forward direction between an anode electrode and a cathode electrode of the diode is defined as a forward resistance value (resistance value) of the diode.

It is noted that although the structures of IGBT 11B and diode 12B have been described using FIG. 3, each of IGBTs 11A, 11C shown in FIG. 2 includes a collector electrode and an emitter electrode in the same manner as in IGBT 11B. Further, each of diodes 12A, 12C includes a cathode electrode and an anode electrode in the same manner as in diode 12B. IGBTs 11A-11C and diodes 12A-12C are connected in parallel to each other.

In FIG. 2, IGBT 11B has a larger on resistance value than on resistance values of IGBT 11A and IGBT 11C, and IGBT 11B has a larger Vce (sat) than Vce (sat) of IGBT 11A and IGBT 11C. It is noted that IGBT 11B has a higher on resistance value than on resistance values of IGBT 11A and IGBT 11C, for example, by of the order of 10 to 20Ω.

Diode 12B has a larger forward resistance value than forward resistance values of diode 12A and diode 12C. Further, diode 12B has a larger rising voltage Vf than rising voltages Vf of diode 12A and diode 12C.

In semiconductor unit 3 configured in this way, when a voltage is applied to a gate electrode of each IGBT and a predetermined voltage is applied to emitter terminal part 9 and collector terminal part 10, current flows through each IGBT and diode.

Since IGBT 11B has a larger on resistance value and a larger saturation voltage Vce (sat) than those of other IGBTs 11A, 11C, the amount of current through IGBT 11B is less than those of other IGBTs 11A, 11C. As a result, IGBT 11B has a less amount of heat generation than those of other IGBTs 11A, 11C. Since IGBTs 11A, 11C are located on either side of IGBT 11B, the heat of IGBTs 11A, 11C can reach IGBT 11B. On the other hand, since IGBT 11B itself has a reduced amount of heat generation, IGBT 11B can be prevented from having a higher temperature as compared with those of other IGBTs 11A, 11C. This allows the life cycles of IGBTs 11A-11C to be equal to each other.

Since diode 12B has a larger forward resistance value and a larger rising voltage Vf than those of diodes 12A, 12C, the amount of current through diode 12B is less than those of other diodes 12A, 12C. As a result, diode 12B has a less amount of heat generation than those of other diodes 12A, 12C. On either side of diode 12B, diodes 12A, 12C are arranged, and heat from diodes 12A, 12C can reach diode 12B. On the other hand, since diode 12B has a reduced amount of heat generation, diodes 12B can be prevented from having a higher temperature as compared with those of other diodes 12A, 12C. This allows the life cycles of diodes 12A-12C to be equal to each other.

It is noted that if some of the elements were damaged in a short period of time, a need for replacement of whole semiconductor unit 3 or semiconductor device 1 would arise, which results in higher running cost of an inverter of a hybrid vehicle, a wind turbine generator, or the like which includes semiconductor device 1. On the other hand, by equalizing the life cycles of diodes and IGBTs in the manner as described above, a reduced running cost of an inverter of a hybrid vehicle, a wind turbine generator, or the like which includes semiconductor device 1, can be achieved.

Further, IGBT 11B and diode 12B are aligned in the second direction Y, and both of IGBT 11B and diode 12B have reduced amounts of heat generation. This prevents one of IGBT 11B and diode 12B from being heated to a high temperature by the heat from the other.

As shown in FIG. 2, on the upper surface of circuit board 5, collector terminal part 10 is arranged between diode 12B and diode 12C and arranged such that longer distances between collector terminal part 10 and the IGBTs 11A-11C are achieved. While the amount of heat generation from the IGBTs is larger than the amount of heat generation by the diodes, distances between collector terminal part 10 and the IGBTs 11A-11C are kept longer. This allows to prevent damage of collector terminal part 10 caused by the heat from IGBTs 11A-11C.

Further, arrangement of collector terminal part 10 between diode 12B and diode 12C can prevent the distances between collector terminal part 10 and the diodes and IGBTs from becoming too long. This can prevent variation between interconnection resistances between collector terminal part 10 and the IGBTs, and also can prevent variation between interconnection resistances between collector terminal part 10 and the diodes.

It is noted that collector terminal part 10 may be arranged at least one of the portions of the upper surface of circuit board 5 which are located between diode 12B and diode 12C and between diode 12A and diode 12B, respectively.

It is noted that as clearly seen from FIG. 1, IGBTs 11A-11C are arranged closer to the outer periphery of semiconductor device 1 than diodes 12A-12C. This facilitates discharge of the heat from IGBTs 11A-11C to the outside, and can promote cooling of IGBTs 11A-11C.

Second Embodiment

Figure 4:
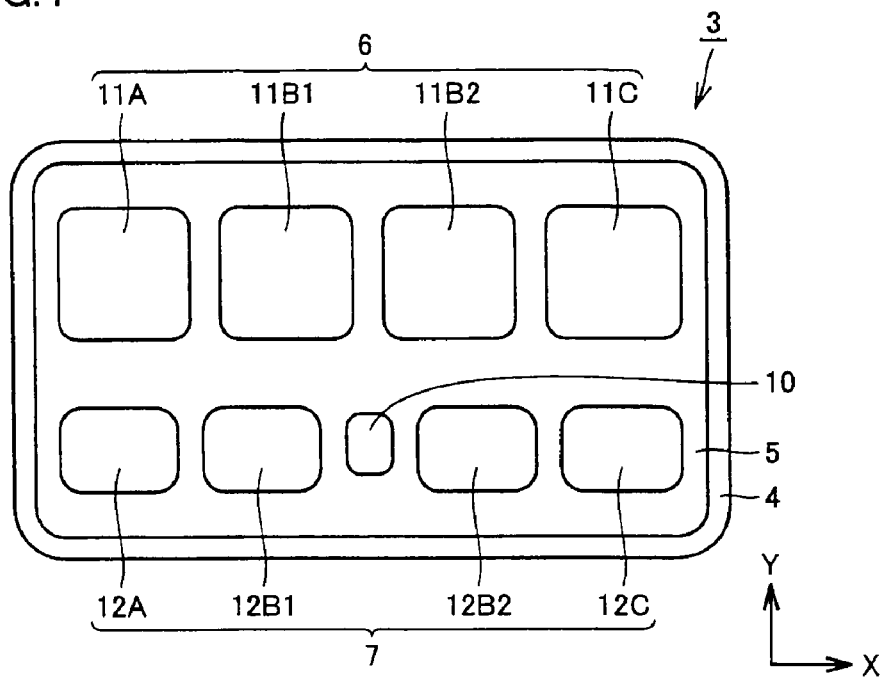
FIG. 4 is a plan view showing a semiconductor unit provided in a semiconductor device according to a second embodiment.

A semiconductor device according to the second embodiment will be described using FIG. 4. In the same manner as the semiconductor device according to the first embodiment shown in FIG. 1, the semiconductor device according to the second embodiment also includes a semiconductor substrate 2 as well as a plurality of semiconductor units 3, control terminal parts 8, and emitter terminal parts 9, which are provided on a main surface of semiconductor substrate 2. FIG. 4 is a plan view showing semiconductor unit 3 provided in a semiconductor device according to the second embodiment.

As shown in FIG. 4, a power semiconductor array 6 includes IGBTs 11A, 11B1, 11B2, and 11C which are aligned and spaced in the first direction X (one direction). Provided between IGBT 11A located on one end of power semiconductor array 6 and IGBT 11C located on the other end are IGBT 11B1 and IGBT 11B2, which are spaced from each other. It is noted that IGBT 11B1 is arranged to be adjacent to IGBT 11A, and that IGBT 11B2 is arranged to be adjacent to IGBT 11C.

This causes the heat of IGBT 11A and IGBT 11B2 to tend to be transferred to IGBT 11B1, and the heat of IGBT 11C and IGBT 11B1 to tend to be transferred to IGBT 11B2.

On the other hand, IGBT 11B1 and IGBT 11B2 have larger on resistance values and saturation voltages Vice (sat) than those of other IGBTs 11A, 11C. This causes IGBT 11B1 and IGBT 11B2 to have smaller amounts of heat generation than the amounts of heat generated by IGBT 11A and IGBT 11C. As a result, equalized temperatures of IGBTs 11A, 11B1, 11B2, 11C are achieved, and the equalized lifetimes of IGBTs 11A, 11B1, 11B2, 11C can be achieved. It is noted that IGBT 11B1 and IGBT 11B2 have higher on resistance values than on resistance values of IGBT 11A and IGBT 11C, by of the order of 10 to 20Ω.

A diode array 7 includes diodes 12A, 12B1, 12B2, 12C which are spaced in the first direction X (one direction). Arranged between diode 12A located on one end of diode array 7 and diode 12C located on the other end are diode 12B1 and diode 12B2. It is noted that diode 12B1 is arranged to be adjacent to diode 12A, and that diode 12 B2 is arranged to be adjacent to diode 12C.

This causes the heat from diode 12B1 and diode 12B2 to tend to be transferred to diode 12B1, and also causes the heat from diode 12C and diode 12B1 to tend to be transferred to diode 12B2.

On the other hand, diode 12B1 and diode 12B2 have larger forward resistance values and larger rising voltages Vf than those of diodes 12A, 12C. This causes diode 12B1 and diode 12B2 to have smaller amounts of heat generation than those of diodes 12A and diode 12C.

As a result, diodes 12A, 12B1, 12B2, 12C have approximately equalized temperatures, and equalized lifetimes of diodes 12A, 12B1, 12B2, 12C have been achieved.

A collector terminal part 10 is arranged at a portion of an upper surface of a circuit board 5 located between diode 12B1 and diode 12B2. The amounts of heat generated by diode 12B1 and diode 12B2 located on either side of collector terminal part 10 are kept small. This prevents damage of collector terminal part 10 caused by the heat from diode 12B1 and diode 12B2.

Arranged at a portion of the upper surface of circuit board 5 adjacent to collector terminal part 10 in the second direction Y are IGBT 11B1 and IGBT 11B2. The amounts of heat generation of IGBT 11B1 and IGBT 11B2 are kept smaller than those of other IGBT 11A and IGBT 11C. This prevents damage of collector terminal part 10 caused by the heat from IGBT 11B1 and IGBT 11B2.

Generally, a diode has a smaller amount of heat generation than the amount of heat generation of an IGBT. Accordingly, by making the distances between collector terminal part 10 and diodes 12B1, 12B2 smaller than the distance between collector terminal part 10 and IGBTs 11B1, 11B2, the heat from IGBT 11B1 and IGBT 11B2 is prevented from reaching collector terminal part 10.

Collector terminal part 10 is located in a central portion of diode array 7. This prevents large difference between the interconnection distances between collector terminal part 10 and diodes 12A-12C. In the same manner, difference between the interconnection distances between collector terminal part 10 and IGBTs 11A-11C is prevented.

Third Embodiment

Figure 5:
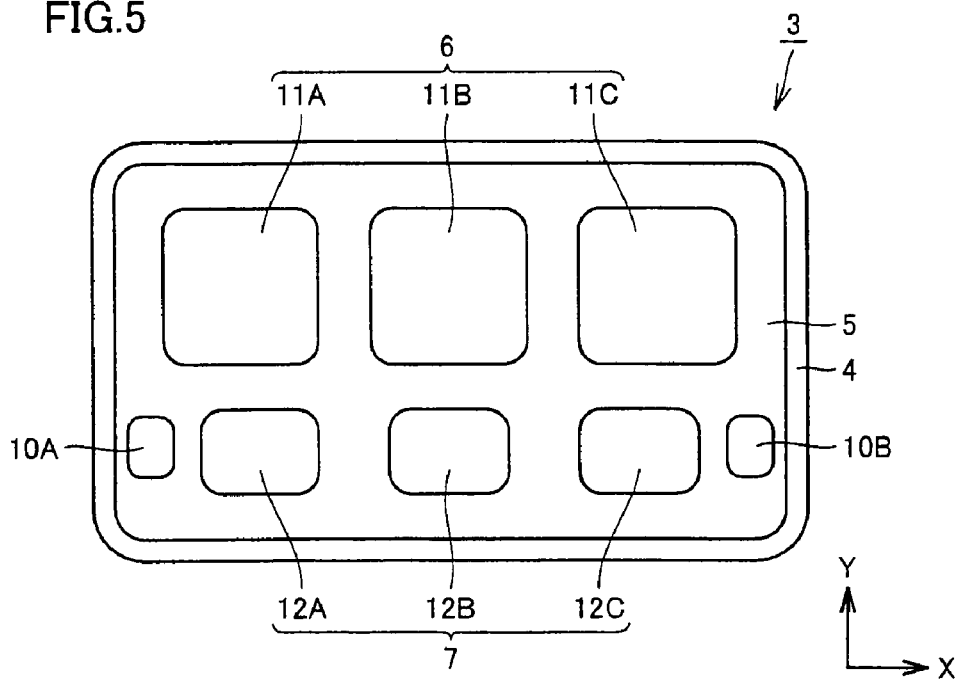
FIG. 5 is a plan view showing a semiconductor unit provided in a semiconductor device according to a third embodiment.

A semiconductor device according to the third embodiment will be described using FIG. 5. In the same manner as in the semiconductor device according to the first embodiment shown in FIG. 1, the semiconductor device according to the third embodiment also includes a semiconductor substrate 2 as well as a plurality of semiconductor units 3, control terminal parts 8, and emitter terminal parts 9, which are provided on a main surface of semiconductor substrate 2. FIG. 5 is a plan view showing semiconductor unit 3 provided in the semiconductor device according to the third embodiment.

As shown in FIG. 5, semiconductor unit 3 includes a power semiconductor array 6 and a diode array 7, and collector terminal parts 10A and 10B. Power semiconductor device array 6 includes IGBTs 11A, 11B, 11C which are aligned in the first direction X, and diode array 7 includes diodes 12A, 12B, 12C which are aligned in the first direction X.

In the example shown in FIG. 5, diode 12B is located in a central portion of diode array 7 in a direction of alignment of diode array 7 and IGBT 11B is located in a central portion of power semiconductor array 6 in a direction of alignment of power semiconductor array.

Collector terminal part 10A is provided to be closer to one end of diode array 7 than the central portion of diode array 7 in the alignment direction. Collector terminal part 10B is arranged to be closer to the other end of diode array 7 than the central portion of diode array 7 in the alignment direction.

To collector terminal part 10A and collector terminal part 10B, interconnect lines connected to diodes 12A-12C are connected. Since collector terminal part 10A and collector terminal part 10B are each provided at a position away from the central portion of diode array 7 in the alignment direction, the interconnect lines can be prevented from concentrating in the central portion of diode array 7 in the alignment direction.

Accordingly, the interconnect lines can be prevented from concentrating around diode 12B located in the central portion of diode array 7, and the heat of diode 12A and diode 12C can be prevented from being transferred to diode 12B via the interconnect lines. This can prevent diode 12B from being heated to a high temperature and can achieve thermal equalization of diodes 12A-12C. This can achieve the equalized lifetimes of diodes 12A-12C.

Particularly, collector terminal part 10A is provided, relative to diode 12A, on the side opposite to diode 12B, and collector terminal part 10B is provided, relative to diode 12C, on the side opposite to diode 12B. This can prevent the interconnect lines from concentrating around diode 12B further effectively.

Collector terminal part 10A is located closer to one end of power semiconductor array 6 than the central portion of power semiconductor array 6 in the alignment direction, and collector terminal part 10B is located closer to the other end of power semiconductor array 6 than the central portion of power semiconductor array 6 in the alignment direction. This can prevent the interconnect lines from concentrating also around IGBT 11B located in the central portion of power semiconductor array 6 in the alignment direction, and can prevent the heat of IGBTs 11A, 11C from being transferred to IGBT 11B. This can achieve thermal equalization of IGBTs 11A-11C and the equalized lifetimes of IGBTs 11A-11C.

As such, concentration of the interconnect lines around IGBT 11B and diode 12B can be prevented, and therefore, heat transfer from one to the other of IGBT 11B and diode 12B can also be prevented.

Here, the on resistance values and the saturation voltages Vce (sat) of IGBTs 11A, 11B, 11C may be made equal to each other, however, it is preferable to make the on resistance value and the saturation voltage Vce (sat) of IGBT 11B higher than on resistance values and the saturation voltages Vce (sat) of IGBTs 11A, 11C. For example, IGBT 11B may have a larger on resistance value than the on resistance values of IGBTs 11A, 11C, by of the order of 10 to 20Ω.

This causes the amount of current through IGBT 11B to be less than the amount of current through IGBTs 11A, 11C, and can cause the amount of heat generated by IGBT 11B to be reduced further. Further, equalization of temperatures between IGBTs 11A, 11B, 11C can be achieved, and the life cycles of IGBTs are allowed to be equal to each other.

It is noted that if equal on resistance values and the saturation voltages Vce (sat) of IGBTs 11A, 11B, 11C are achieved, the same IGBT can be employed for IGBTs 11A, 11B, 11C, and a reduced manufacturing cost can be achieved.

In the same manner, the forward resistance values and the rising voltages Vf of diodes 12A, 12B, 12C may be made equal to each other, however, it is preferable to make the forward resistance value and the rising voltage Vf of diode 12B higher than the forward resistance values and the rising voltages Vf of diodes 12A, 12C.

This causes the amount of current through diode 12B to be less than the amount of current through diodes 12A, 12C, and the amount of heat generated by diode 12B can be kept small, and the life cycles of diodes are allowed to be equal to each other.

It is noted that if the forward resistance values and the rising voltages Vf of diodes 12A, 12B, 12C are allowed to be equal to each other, diodes with the same performance can be employed for diodes 12A, 12B, 12C, and a reduced manufacturing cost can be achieved.

Fourth Embodiment

Figure 6:
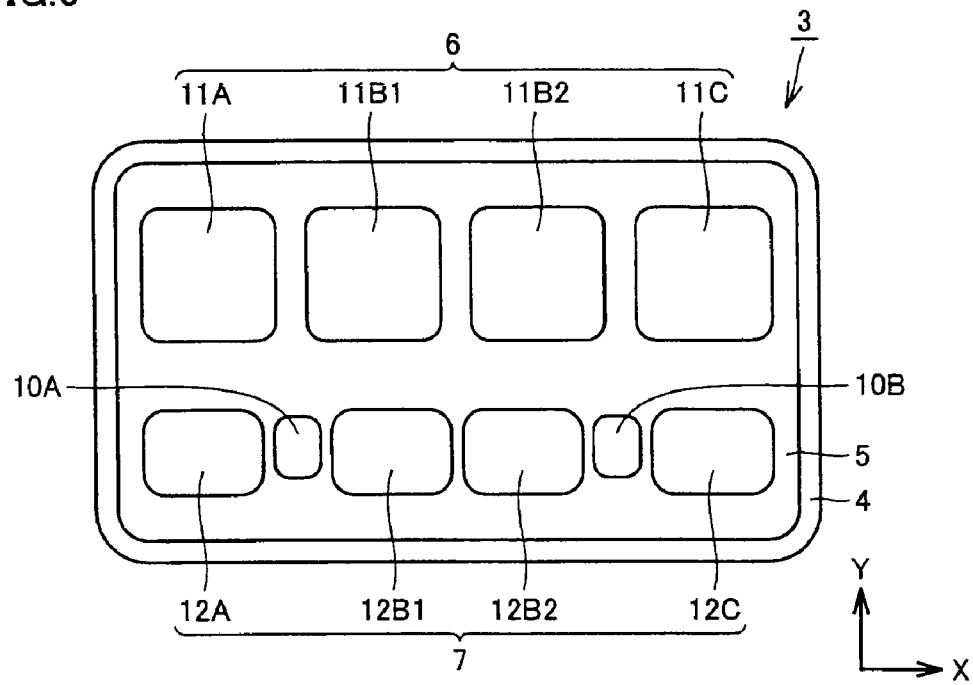
FIG. 6 is a plan view showing a semiconductor unit provided in a semiconductor device according to a fourth embodiment.

A semiconductor device according to the fourth embodiment will be described using FIGS. 6-8. In the same manner as in the semiconductor device according to the first embodiment shown in FIG. 1, the semiconductor device according to the fourth embodiment also includes a semiconductor substrate 2 as well as a plurality of semiconductor units 3, control terminal parts 8, and emitter terminal parts 9, which are provided on a main surface of semiconductor substrate 2. FIG. 6 is a plan view showing semiconductor unit 3 provided in the semiconductor device according to the fourth embodiment.

In the example shown in FIG. 6, semiconductor unit 2 includes a circuit board 5, a power semiconductor array 6 arranged on an upper surface of circuit board 5, a diode array 7, and collector terminal parts 10A, 10B. Power semiconductor array 6 includes IGBTs 11A, 11B1, 11B2, 11C which are aligned in one direction. IGBT 11A is located on one end of power semiconductor array 6, and IGBT 11C is located on the other end. IGBT 11B1 and IGBT 11B2 are located between IGBT 11A and IGBT 11C, and a central portion of power semiconductor array 6 in a direction of alignment is located between IGBT 11B1 and IGBT 11B2.

Diode array 7 includes diode 12A located on one end of diode array 7, a diode 12C located on the other end, and diodes 12B1, 12B2 located between diode 12A and diode 12C. Diode 12B1 is provided to be adjacent to diode 12A, and diode 12B2 is provided to be adjacent to diode 12C.

A central portion of diode array 7 is a portion located between diode 12B1 and diode 12B2. Collector terminal part 10A is provided between diode 12A and diode 12B1, and collector terminal part 10A is provided to be away from the central portion of diode array 7 toward one end of diode array 7. Collector terminal part 10B is provided between diode 12B2 and diode 12C, and collector terminal part 10B is provided to be away from the central portion of diode array 7 toward the other end of diode array 7.

To collector terminal parts 10A, 10B, interconnect lines connected to diodes 12A-12C are connected, while collector terminal parts 10A, 10B are provided at positions away from the central portion of diode array 7, respectively.

This can prevent the interconnect lines from concentrating around diode 12B1 and diode 12B2, and particularly, can prevent heat transfer between diode 12B1 and diode 12B2. This allows for approximate equalization of the amount of heat transferred from surroundings of diodes 12B1, 12B2 to diodes 12B1, 12B2 and the amount of heat transferred from surroundings of diodes 12A, 12C to diodes 12A, 12C.

Arranged on either side of collector terminal part 10A are diode 12A and diode 12B1. Arranged on either side of collector terminal part 10B are diode 12B2 and diode 12C. This allows the interconnection distances between diode 12A and collector terminal part 10A, diode 12B1 and collector terminal part 10A, diode 12B2 and collector terminal part 10B, and diode 12C and collector terminal part 10B, to be approximately equal to each other. This can prevent difference between the amounts of current supplied to the diodes.

As such, equalization of the amounts of heat transferred from surroundings to diodes 12A-12C and equalization of the amounts of current supplied to diodes 12A-12C are achieved, and therefore, diode 12B1 and diode 12B2 can be prevented from being heated to a high temperature. Further, thermal equalization of diodes 12A, 12B1, 12B2, 12C and equalization of the lifetimes of diodes 12A, 12B1, 12B2, 12C can be achieved.

Power semiconductor array 6 includes IGBTs 11A, 11B1, 11B2, 11C, and the central portion of power semiconductor array 6 is located between IGBT 11B1 and IGBT 11B2.

Collector terminal part 10A is located away from the central portion of power semiconductor array 6 toward one end of power semiconductor array 6 and spaced in a direction opposite to the second direction Y. Collector terminal part 10B is located away from the central portion of power semiconductor array 6 toward the other end of power semiconductor array 6 and spaced in a direction opposite to the second direction Y.

This can prevents the interconnect lines from concentrating around the central portion of power semiconductor array 6 and its surroundings, and can prevent the interconnect lines from concentrating around the surroundings of IGBT 11B1 and IGBT 11B2.

As a result, heat transfer between IGBT 11B1 and IGBT 11B2 can be prevented, and the difference between the amount of heat transferred from surroundings of IGBTs 11B1, 11B2 to IGBTs 11B1, 11B2 and the amount of heat transferred from surroundings of IGBTs 11A1, 11C to IGBTs 11A1, 11C can be prevented. The distance between collector terminal part 10A and IGBT 11A, the distance between collector terminal 10A and IGBT 11B1, the distance between collector terminal part 10B and IGBT 11B2, and the distance between collector terminal part 10B and IGBT 11C are approximately equal, and equalization of the amounts of current through IGBTs 11A, 11B1, 11B2, 11C, respectively, can be achieved.

Thus, equalization of temperatures of IGBTs 11A, 11B1, 11B2, 11C and equalization of the lifetimes of IGBTs 11A, 11B1, 11B2, 11C can be achieved.

Figure 7:
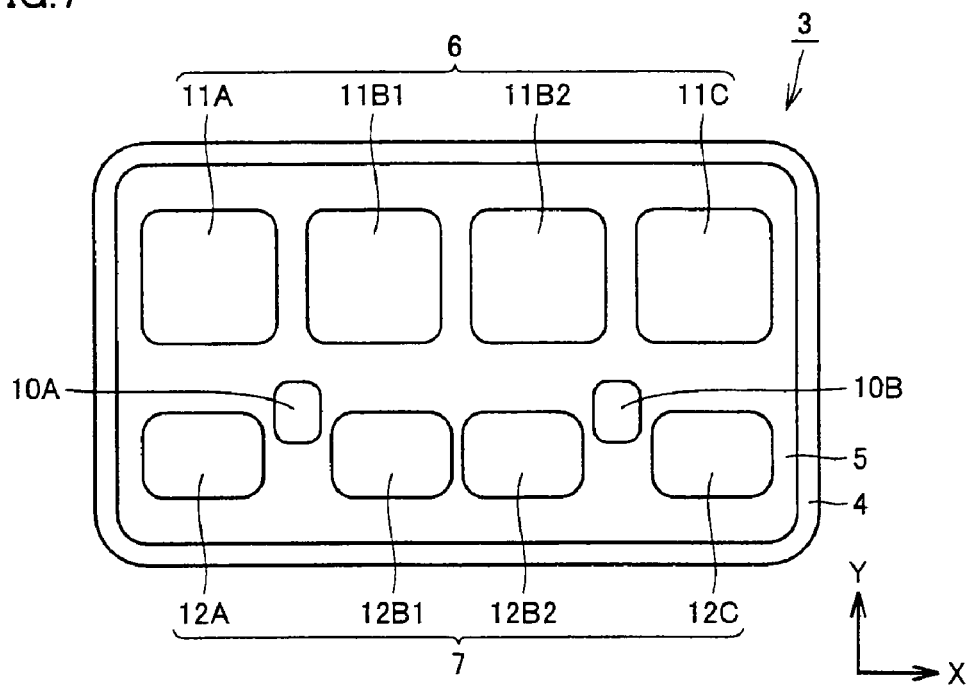
FIG. 7 is a plan view showing a variation of positions of collector terminal parts.

FIG. 7 is a plan view showing a variation of positions of collector terminal part 10A and collector terminal part 10B. FIG. 8 is a cross sectional view through semiconductor device 1 including semiconductor unit 3 shown in FIG. 7.

Figure 8:
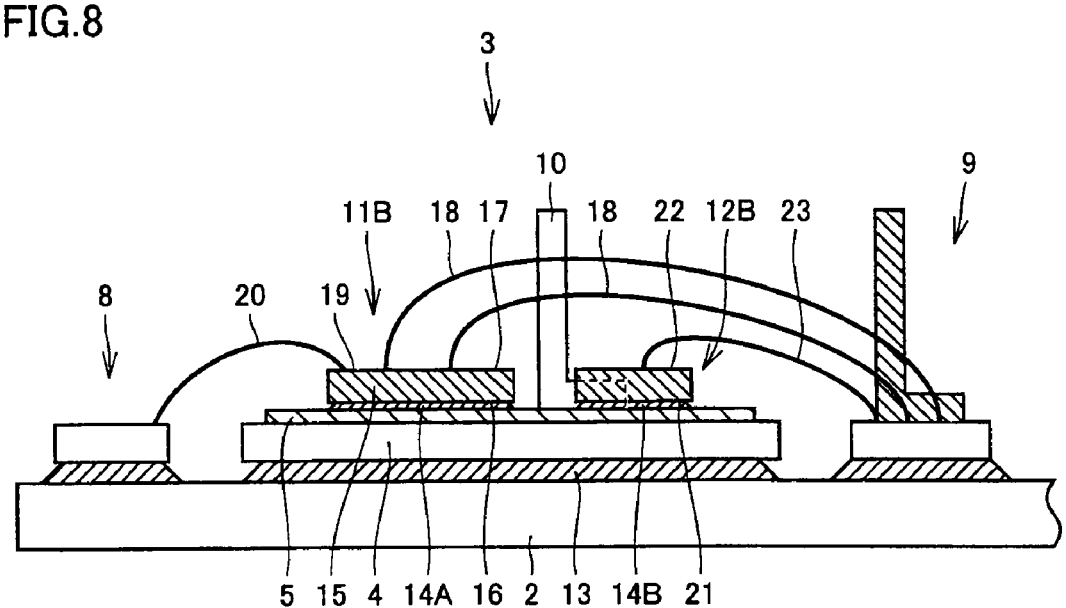
FIG. 8 is a cross sectional view through a semiconductor device including the semiconductor unit shown in FIG. 7.

In the example shown in FIGS. 7 and 8, collector terminal part 10A is arranged to extend from a portion of the upper surface of interconnect lines substrate 5 located between diode 12A and diode 12B1, to an area located between diode array 7 and power semiconductor array 6. This allows for shortening of the distances between collector terminal part 10A and IGBTs 11A, 11B1 and the length of the interconnect lines can be kept short. For this reason, the interconnection length of not only diodes 12A, 12B1, but also of IGBTs 11A, 11B1 are kept short.

Collector terminal part 10B is arranged to extend from a portion of the upper surface of circuit board 5 located between diode 12B2 and diode 12C, to an area of the upper surface of circuit board 5 located between power semiconductor array 6 and diode array 7. This allows the distances between collector terminal part 10B and IGBTs 11B2, 11C and diodes 12B2, 12C to be kept short and the length of the interconnect lines can be kept short.

As such, the length of interconnect lines to be connected to collector terminal parts 10A, 10B can be kept short, and therefore, the density of interconnect lines of circuit board 5 can be kept low. As a result, heat transfer between elements via interconnect lines can be prevented.

Here, in semiconductor unit 3 showing FIGS. 6 and 7, the on resistance values and the saturation voltages Vce (sat) of IGBTs 11A, 11B1, 11B2, 11C may be made equal to each other, however, preferably, the on resistance value and the saturation voltage Vce (sat) of IGBTs 11B1, 11B2 may be made higher than those of IGBTs 11A, 11C. This can achieve equalized temperatures and equal life cycles of IGBTs 11A, 11B1, 11B2, 11C.

In the same manner, in FIGS. 6 and 7, the forward resistance values and the rising voltages Vf of diodes 12A, 12B1, 12B2, 12C may be made equal to each other, however, it is preferable to make the forward resistance values and the rising voltages Vf of diodes 12B1, 12B2 higher than the forward resistance values and the rising voltages Vf of diodes 12A, 12C. This can achieve equalized temperatures and equal life cycles of diodes 12A, 12B1, 12B2, 12C.

Fifth Embodiment

Figure 9:
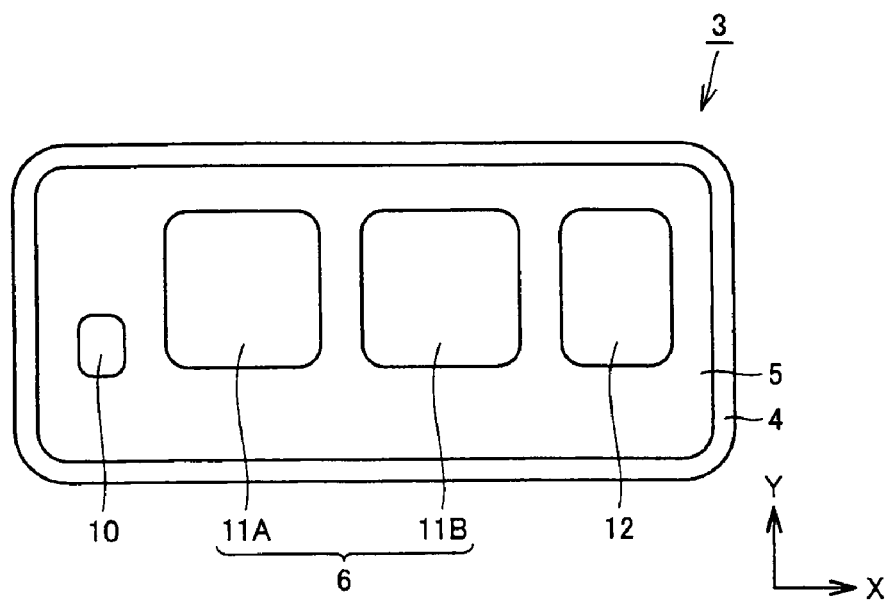
FIG. 9 is a plan view showing a semiconductor unit provided in a semiconductor device according to a fifth embodiment.

A semiconductor device according to the fifth embodiment will be described using FIG. 9. In the same manner as the semiconductor device according to the first embodiment shown in FIG. 1, the semiconductor device according to the fifth embodiment also includes a semiconductor substrate 2 as well as a plurality of semiconductor units 3, control terminal parts 8, and emitter terminal parts 9, which are provided on a main surface of semiconductor substrate 2. FIG. 9 is a plan view showing semiconductor unit 3 provided in the semiconductor device according to the fifth embodiment.

As shown in FIG. 9, in the fifth embodiment, semiconductor unit 3 includes a circuit board 5, an array of elements aligned in one direction, and collector terminal part 10 spaced apart from the array of elements. The array of elements includes a power semiconductor array 6 including a plurality of IGBT 11A, 11B which are aligned in the first direction X, and a diode 12 spaced apart from one end of power semiconductor array 6. Collector terminal part 10 is spaced apart from the other end of power semiconductor array 6.

IGBT 11B has a higher on resistance value and a higher saturation voltage Vce (sat) than the resistance value and the saturation voltage Vce (sat) of IGBT 11A. This causes, when semiconductor device 1 is driven, the amount of current through IGBT 11B to be less than the amount of current through IGBT 11A, and the amount of the heat generated by IGBT 11 is kept smaller than that of IGBT 11A.

When the semiconductor device is driven, IGBT 11A may receive heat transferred from IGBT 11B, and diode 12 may receive heat transferred from IGBT 11B. IGBT 11B may receive heat from IGBT 11A and diode 12.

The amount of heat transferred to IGBT 11B may be larger than that to IGBT 11A and diode 12, while the amount of heat generated by IGBT 11B is kept lower than the amount of heat generated by IGBT 11A. This allows equalization of temperature of IGBT 11A and IGBT 11B and equalization of their life cycles to be achieved.

Sixth Embodiment

Figure 10:
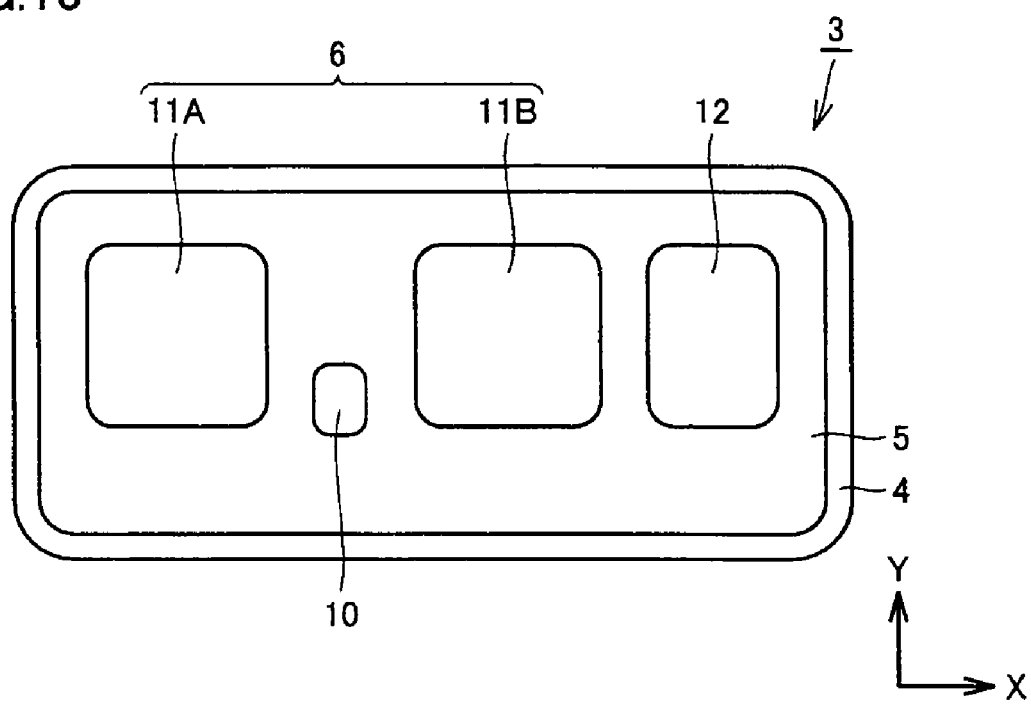
FIG. 10 is a plan view showing a semiconductor unit provided in a semiconductor device according to a sixth embodiment.

A semiconductor device according to the sixth embodiment will be described using FIG. 10. In the same manner as the semiconductor device according to the first embodiment shown in FIG. 1, the semiconductor device according to the sixth embodiment also includes a semiconductor substrate 2 as well as a plurality of semiconductor units 3, control terminal parts 8, and emitter terminal parts 9, which are provided on a main surface of semiconductor substrate 2. FIG. 10 is a plan view showing semiconductor unit 3 provided in the semiconductor device according to the sixth embodiment.

In FIG. 10, semiconductor unit 3 includes an array of elements including a power semiconductor array 6 and a diode 12. Power semiconductor array 6 includes an IGBT 11A and an IGBT 11B which are aligned in one direction. Diode 12 is spaced apart from one end of power semiconductor array 6. A collector terminal part 10 is arranged between IGBT 11A and IGBT 11B.

By arranging collector terminal part 10 between IGBT 11A and IGBT 11B, the interconnection length of the interconnect lines connecting collector terminal part 10 and IGBT 11A and the interconnection length of the interconnect lines connecting collector terminal 10 and IGBT 11B can be approximately made equal, and the length of the interconnect lines can be kept short.

By approximately equalizing the interconnection length of interconnect lines, the interconnection resistance of the interconnect lines are allowed to be equal to each other. By allowing the on resistance and the saturation voltage Vce (sat) of IGBT 11A and the on resistance and the saturation voltage Vce (sat) of IGBT 11B to be equal to, the amounts of current through IGBT 11A and IGBT 11B are allowed to be equal to each other. This allows the amounts of heat generated by IGBT 11A and IGBT 11B to be equal to each other.

By arranging collector terminal part 10 between IGBT 11A and IGBT 11B, less interconnect lines is located between IGBT 11B and diodes 12. This can prevent the heat of diode 12 from being transferred via the interconnect lines to IGBT 11B.

As such, by preventing heat transfer from diode 12 to IGBT 11B and allowing the amounts of heat generated by IGBT 11A and IGBT 11B to be substantially equal to each other, the life cycles of IGBT 11A and IGBT 11B are allowed to be equal to each other.

It is noted that IGBT 11B may have a higher on the resistance value and a higher saturation voltage Vce(sat) than the on the resistance value and the saturation voltage Vce(sat) of IGBT 11A.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
a power semiconductor array formed of a plurality of power semiconductors aligned and spaced in one direction, said power semiconductors each including an emitter electrode and a collector electrode; and
a diode array spaced apart from said power semiconductor array in a direction intersecting with said one direction and formed of a plurality of diodes aligned and spaced in said one direction,
said power semiconductor array including a first power semiconductor located on one end of said power semiconductor array, a second power semiconductor located on another end, and a third power semiconductor located between said first power semiconductor and said second power semiconductor,
said diode array including a first diode located on one end of said diode array, a second diode located on another end, and a third diode located between said first diode and said second diode,
a resistance value between said emitter electrode and said collector electrode in ON state being higher at said third power semiconductor than at said first power semiconductor and at said second power semiconductor, and upon application of a voltage of not less than a rising voltage, said third diode having a higher resistance value than resistance values of said first diode and said second diode upon application of a voltage of not less than a rising voltage.

2. The semiconductor device according to claim 1, further comprising:

an insulating substrate;

a circuit board provided on said insulating substrate and having an upper surface, said power semiconductor array and said diode array being arranged on said upper surface; and a connecting terminal provided on said circuit board and connected to said circuit board, wherein said connecting terminal is arranged at least one of between said third diode and said first diode and between said third diode and said second diode.

3. The semiconductor device according to claim 1, further comprising:

an insulating substrate;

a circuit board provided on said insulating substrate and having an upper surface, said power semiconductor array and said diode array being arranged on said upper surface; and a connecting terminal provided on said circuit board and connected to said circuit board, wherein a plurality of said third diodes are provided and spaced in said one direction, and said connecting terminal is arranged between said third diodes.

4. The semiconductor device according to claim 1, wherein a plurality of said third power semiconductors are provided between said first power semiconductor and said second power semiconductor and spaced.

5. A semiconductor device comprising:

an insulating substrate;

a circuit board provided on said insulating substrate;

an array of elements provided on said circuit board and including a plurality of elements aligned and spaced in one direction;

a first connecting terminal located closer to one end of said array of elements than a central portion of said array of elements on an upper surface of said circuit board; and a second connecting terminal located closer to another end of said array of elements than the central portion of said array of elements on said upper surface of said circuit board.

6. The semiconductor device according to claim 5, wherein said elements are power semiconductors each including an emitter electrode and a collector electrode, said array of elements is a power semiconductor array, said power semiconductor array includes a first power semiconductor located on one end of said power semiconductor array, a second power semiconductor located on another end, and a third power semiconductor located between said first power semiconductor and said second power semiconductor, and a resistance value between said emitter electrode and said collector electrode in ON state is higher at said third power semiconductor than at said first power semiconductor and at said second power semiconductor.

7. The semiconductor device according to claim 6, wherein a plurality of said third power semiconductors are provided and spaced.

8. The semiconductor device according to claim 5, wherein said array of elements includes a first element located on one end and a second element located on another end, and a third element located between said first element and said second element, said first connecting terminal is provided, relative to said first element, on a side opposite to said third element, and said second connecting terminal is provided, relative to said third element, on a side opposite to said second element.

9. The semiconductor device according to claim 5, wherein said array of elements includes a first element located on one end, a second element located on another end, a third element located between said first element and said second element and adjacent to said first element, and a fourth element located between said first element and said second element and adjacent to said second element, said first connecting terminal is provided between said first element and said third element, and said second connecting terminal is provided between said second element and said fourth element.

10. The semiconductor device according to claim 5, wherein said elements are each a diode, said array of elements is a diode array, said diode array includes a first diode located on one end of said diode array, a second diode located on another end, and a third diode located between said first diode and said second diode, and upon application of a voltage of not less than a rising voltage, said third diode has a higher resistance value than resistance values of said first diode and said second diode upon application of a voltage of not less than a rising voltage.

11. A semiconductor device comprising:

an insulating substrate;

a circuit board provided on said insulating substrate;

a power semiconductor array provided on said circuit board and including a plurality of power semiconductors aligned in one direction; and a connecting terminal spaced apart from one end of said power semiconductor array, said power semiconductors each including an emitter electrode and a collector electrode, said power semiconductor array including a first power semiconductor located on said one end and a second power semiconductor located on another end, and a resistance value between said emitter electrode and said collector electrode in ON state being higher at said first power semiconductor than at said second power semiconductor.

12. A semiconductor device comprising:

an insulating substrate;

a circuit board provided on said insulating substrate;

a first power semiconductor and a second power semiconductor provided on said circuit board and spaced;

a connecting terminal connected to a portion of an upper surface of said circuit board, said portion being located between said first power semiconductor and said second power semiconductor; and a diode located, relative to said second power semiconductor, on a side opposite to said connecting terminal.

* * * * *